United States Patent
Shibata

(10) Patent No.: US 6,812,097 B2
(45) Date of Patent: Nov. 2, 2004

(54) METHOD FOR MANUFACTURING NON-VOLATILE MEMORY DEVICE

(75) Inventor: Takumi Shibata, Ichinomiya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/361,782

(22) Filed: Feb. 10, 2003

(65) Prior Publication Data

US 2004/0005761 A1 Jan. 8, 2004

(30) Foreign Application Priority Data

Feb. 15, 2002 (JP) ........................................ 2002-037834

(51) Int. Cl.[7] .......................................... H01L 21/8247
(52) U.S. Cl. ..................................... 438/257; 438/954
(58) Field of Search ............................... 438/257–267, 438/954

(56) References Cited

U.S. PATENT DOCUMENTS

| | | | | |
|---|---|---|---|---|
| 6,413,821 B1 | * | 7/2002 | Ebina et al. ................. | 438/257 |
| 6,518,124 B1 | * | 2/2003 | Ebina et al. ................. | 438/257 |
| 2001/0045586 A1 | * | 11/2001 | Jan et al. ..................... | 257/296 |
| 2003/0054610 A1 | | 3/2003 | Ebina et al. | |
| 2003/0057505 A1 | | 3/2003 | Ebina et al. | |
| 2003/0058705 A1 | | 3/2003 | Ebina et al. | |
| 2003/0060011 A1 | | 3/2003 | Ebina et al. | |

* cited by examiner

*Primary Examiner*—Richard A. Booth
(74) *Attorney, Agent, or Firm*—Harness, Dickey & Pierce, P.L.C.

(57) ABSTRACT

A method is provided for manufacturing a MONOS type non-volatile memory device. The method comprises the following steps: a step of pattering a stopper layer and a first conductive layer; a step of forming an ONO film composed of a first silicon oxide layer, a silicon nitride layer and a second silicon oxide layer above a semiconductor substrate and on both sides of the first conductive layer; a step of forming a second conductive layer above the ONO film 220; a step of anisotropically etching the second conductive layer, and then isotropically etching the same, thereby forming control gates in the form of sidewalls through the ONO films on both side surfaces of the first conductive layer; and a step of patterning the first conductive layer to form a word gate.

9 Claims, 9 Drawing Sheets

US 6,812,097 B2

METHOD FOR MANUFACTURING NON-VOLATILE MEMORY DEVICE

TECHNICAL FIELD

The present invention relates to a method for manufacturing a non-volatile memory device, and more particularly to a method for manufacturing a non-volatile memory device having a plurality of charge storing regions for each word gate.

BACKGROUND

Non-volatile semiconductor memory devices include a MONOS (Metal Oxide Nitride Oxide Semiconductor) type and a SONOS (Silicon Oxide Nitride Oxide Silicon) type in which a gate dielectric layer between a channel region and a control gate is composed of a stacked layered body of a silicon oxide layer—a silicon nitride layer—a silicon oxide layer, wherein a charge is trapped in the silicon nitride layer.

One known MONOS type non-volatile memory device is shown in FIG. 14 (H. Hayashi, et al, 2000 Symposium on VLSI Technology Digest of Technical Papers p.122–p.123).

The MONOS type memory cell 100 has a word gate 14 formed over a semiconductor substrate 10 through a first gate dielectric layer 12. Also, a first control gate 20 and a second control gate 30 in the form of sidewalls are disposed on both sides of the word gate 14. A second gate dielectric layer 22 is present between a bottom section of the first control gate 20 and the semiconductor substrate 10, and a dielectric layer 24 is present between a side surface of the first control gate 20 and the word gate 14. Similarly, a second gate dielectric layer 22 is present between a bottom section of the second control gate 30 and the semiconductor substrate 10, and a dielectric layer 24 is present between a side surface of the second control gate 30 and the word gate 14. Impurity layers 16 and 18 that each compose a source region or a drain region are formed in the semiconductor substrate 10 between the opposing control gates 20 and 30 of adjacent memory cells.

In this manner, each memory cell 100 includes two MONOS type memory elements on the side surfaces of the word gate 14. Also, these MONOS type memory elements are independently controlled. Therefore, a single memory cell 100 can store 2-bit information.

One object of the present invention is to provide a method for manufacturing a MONOS type non-volatile memory device having a plurality of charge storing regions.

SUMMARY

A method for manufacturing a non-volatile memory device in accordance with one embodiment of the present invention comprises the following steps. A first dielectric layer is formed above a semiconductor layer, a first conductive layer is formed above the first dielectric layer, and a stopper layer is formed above the first conductive layer. The stopper layer and the first conductive layer are then patterned. An ONO film composed of a first silicon oxide layer, a silicon nitride layer and a second silicon oxide layer is formed above the semiconductor layer and on both sides of the first conductive layer. A second conductive layer is then formed above the ONO film. Next, the second conductive layer is anisotropically etched, and then the second conductive layer is isotropically etched to form sidewall-like control gates on both side surfaces of the first conductive layer through the ONO film. An impurity layer that is to become a source region or a drain region is then formed in the semiconductor layer. Next, a second dielectric layer is formed over an entire surface of the substrate. The second dielectric layer is then polished such that the stopper layer is exposed and then the stopper layer is removed. Finally, the first conductive layer is patterned to form a word gate.

DETAILED DESCRIPTION

1. Structure of a Non-Volatile Memory Device

Figure 1:
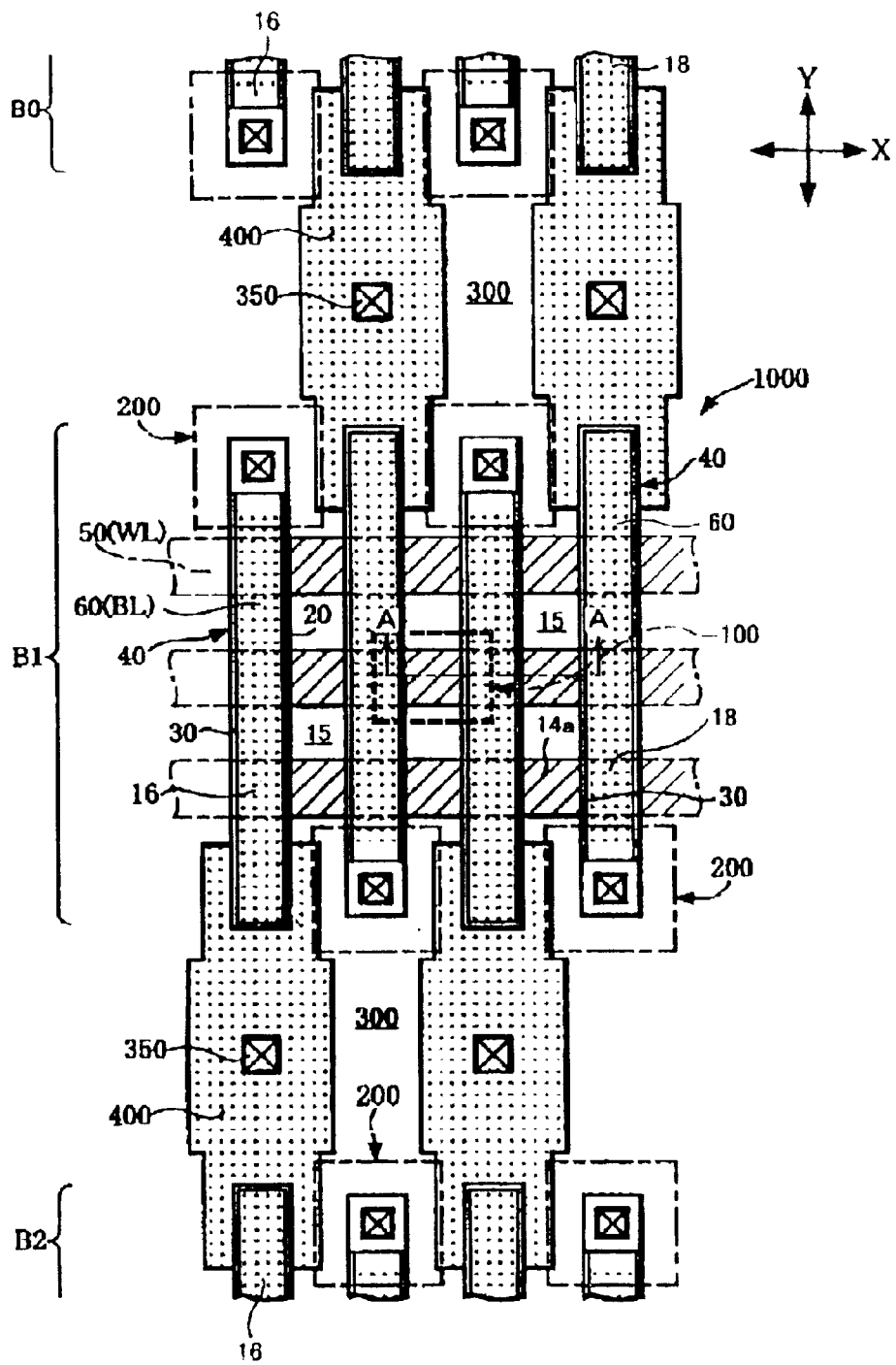
FIG. 1 schematically shows a plan view illustrating a layout of a semiconductor device.

FIG. 1 shows a plan view of a layout of a semiconductor device including a non-volatile memory device that is obtained by a manufacturing method in accordance with the present embodiment.

The semiconductor device includes a memory region 1000. MONOS type non-volatile memory devices (hereafter referred to as "memory cells") are arranged in a plurality of rows and columns in a matrix configuration in the memory region 1000. In the memory region 1000, a first block B1 and parts of adjacent other blocks B0 and B2 are shown. Each of the blocks B0 and B2 has a structure that is reverse of that of the block B1.

An element isolation region 300 is formed in part of the region between the first block B1 and the adjacent blocks B0 and B2. A plurality of word lines (WL) 50 extending in an X direction (row direction) and a plurality of bit lines (BL) 60 extending in a Y direction (column direction) are provided in each of the blocks. Each one of the word lines 50 is connected to a plurality of word gates 14a arranged in the X direction. The bit lines 60 are composed of impurity layers 16 and 18.

A conductive layer 40, which composes the first and second control gates 20 and 30, is formed in a manner to enclose each of the impurity layers 16 and 18. In other words, the first and second control gates 20 and 30 extend respectively in the Y direction, and first end sections of one set of the first and second control gates 20 and 30 are mutually connected by the conductive layer that extends in the X direction. Further, the other end sections of the one set of the first and second control gates 20 and 30 are both connected to one common contact section 200. Therefore, the conductive layer 40 functions as a control gate of a memory cell, and functions as a wiring that connects the control gates together that are arranged in the Y direction.

Each of the memory cells 100 includes one word gate 14a, first and second control gates 20 and 30, and impurity layers 16 and 18. The first and second control gates 20 and 30 are formed on both sides of the word gate 14a. The impurity layers 16 and 18 are formed on the outer sides of the control gates 20 and 30. The impurity layers 16 and 18 are commonly shared by adjacent memory cells 100.

The impurity layers 16 that are mutually arranged adjacent to each other in the Y direction, i.e., the impurity layer 16 formed in the block B1 and the impurity layer 16 formed in the block B2, are mutually electrically connected by a contact impurity layer 400 that is formed within the semiconductor substrate. The contact impurity layer 400 is formed on the opposite side of the common contact section 200 of the control gates with respect to the impurity layer 16.

A contact 350 is formed on the contact impurity layer 400. The bit lines 60 composed of the impurity layers 16 are electrically connected to wiring layers in upper layers through the contact 350.

Similarly, two adjacent impurity layers 18 arranged in the Y direction, i.e., the impurity layer 18 formed in the block B1 and the impurity layer 18 formed in the block B0, are mutually electrically connected by the contact impurity layer 400 on the side where the common contact section 200 is not disposed. As seen in FIG. 1, in each of the blocks, the plurality of common contact sections 200 for the impurity layers 16 and the impurity layers 18 are arranged on mutually opposite sides in a staggered fashion as viewed in a plan view layout. Also, in each of the blocks, the plurality of contact impurity layers 400 for the impurity layers 16 and the impurity layers 18 are arranged on mutually opposite sides in a staggered fashion as viewed in a plan view layout.

Figure 2:
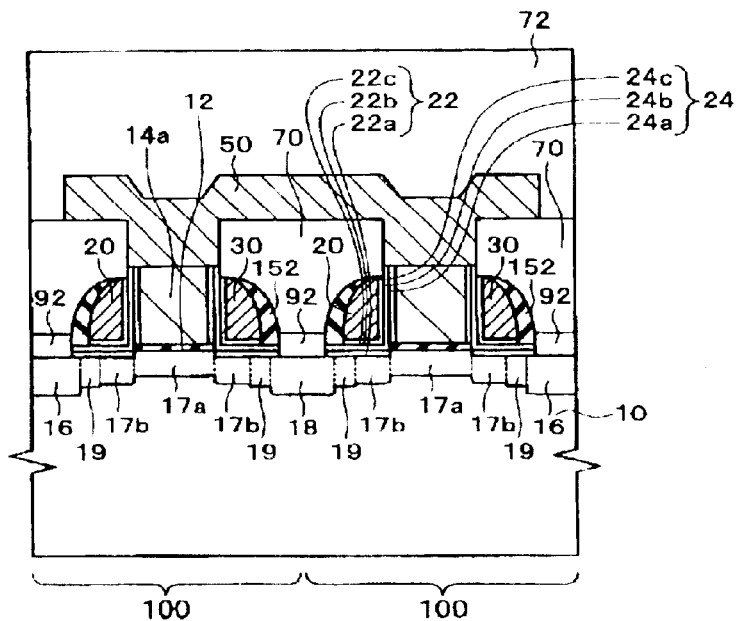
FIG. 2 schematically shows a cross-sectional view taken along a line A—A of FIG. 1.
Figure 3:
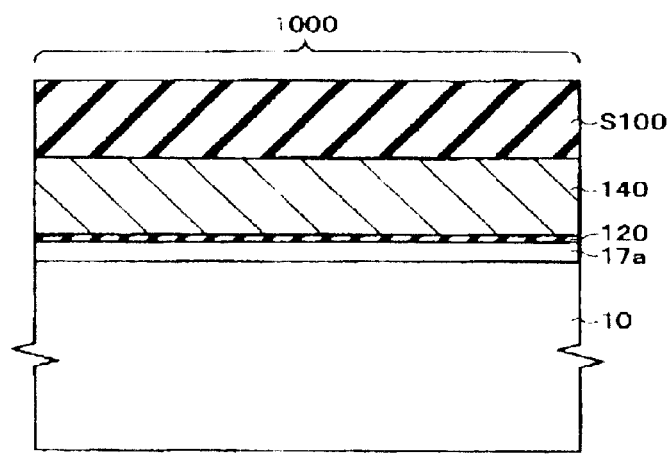
FIG. 3 shows one step in accordance with an embodiment of the present invention.

Referring to FIG. 2, a cross-sectional structure of the semiconductor device is described. FIG. 2 is a cross-sectional view taken along a line A—A of FIG. 1.

In the memory region 1000, the memory cell 100 includes a word gate 14a, impurity layers 16 and 18, a first control gate 20 and a second control gate 30. The word gate 14a is formed above the semiconductor substrate 10 through a first gate dielectric layer 12. The impurity layers 16 and 18 are formed in the semiconductor substrate 10. Each of the impurity layers is to become a source region or a drain region. Also, silicide layers 92 are formed on the impurity layers 16 and 18.

The first and second control gates 20 and 30 are formed along both sides of the word gate 14a. The first control gate 20 is formed above the semiconductor substrate 10 through a second gate dielectric layer 22, and formed on one of the side surfaces of the word gate 14a through a side dielectric layer 24. Similarly, the second control gate 30 is formed above the semiconductor substrate 10 through a second gate dielectric layer 22, and formed on the other side surface of the word gate 14a through a side dielectric layer 24. A cross-sectional configuration of each of the control gates is similar to the cross-sectional configuration of a sidewall dielectric layer on a conventional MOS transistor.

The second gate dielectric layer 22 is an ONO film. More specifically, the second gate dielectric layer 22 is a stacked layered film composed of a bottom silicon oxide layer (a first silicon oxide layer) 22a, a silicon nitride layer 22b and a top silicon oxide layer (a second silicon oxide layer) 22c.

The first silicon oxide layer 22a forms a potential barrier between a channel region and a charge storing region. The silicon nitride layer 22b functions as a charge storing region that traps carriers (for example, electrons). The second silicon oxide layer 22c forms a potential barrier between the control gate and the charge storing region.

The side dielectric layer 24 is an ONO film. More specifically, the side dielectric layer 24 is composed of a stacked layer of a first silicon oxide layer 24a, a silicon nitride layer 24b and a second silicon oxide layer 24c. The side dielectric layers 24 electrically isolates the word gate 14a from the control gates 20 and 30, respectively. Also, the upper ends of at least the first silicon oxide layers 24a of the side dielectric layers 24 are positioned above the upper ends of the control gates 20 and 30 with respect to the semiconductor substrate 10 in order to prevent short-circuits of the word gate 14a and the first and second control gates 20 and 30.

The side dielectric layers 24 and the second gate dielectric layers 22 are formed in the same film forming steps, and have the same layered structure.

A dielectric layer 70 is formed between the adjacent first control gate 20 and second control gate 30 of adjacent ones of the memory cells 100. The dielectric layer 70 covers the control gates 20 and 30 such that at least the gates 20 and 30 are not exposed. Furthermore, an upper surface of the dielectric layer 70 is positioned above an upper surface of the word gate 14a with respect to the semiconductor substrate 10. By forming the dielectric layer 70 in this manner, electrical isolation of the first and second control gates 20 and 30 from the word gate 14a and the word line 50 can be more securely achieved.

An interlayer dielectric layer 72 is formed over the semiconductor substrate 10 where the memory cells 100 are formed.

2. Method for Manufacturing the Non-Volatile Memory Device

Next, referring to FIGS. 3–13, a method for manufacturing a non-volatile memory device in accordance with an embodiment of the present invention is described. Each cross-sectional view corresponds to a cross section taken along a line A—A of FIG. 1. Also, portions in FIGS. 3–13 that are substantially the same as the portions indicated in FIGS. 1 and 2 are assigned the same reference numbers, and their description is not repeated.

(1) First, an element isolation region 300 (see FIG. 1) is formed on a surface of a semiconductor substrate 10 by a trench isolation method. Next, an impurity layer 17*a* is formed in the semiconductor substrate 10 by implanting ions of a P-type impurity as a channel dope. Then, a contact impurity layer 400 (see FIG. 1) is formed in the semiconductor substrate 10 by implanting ions of an N-type impurity.

Next, a dielectric layer 120 that is to become a gate dielectric layer is formed on the surface of the semiconductor substrate 10. Then, a gate layer (first conductive layer) 140 that is to become word gates 14*a* is deposited on the dielectric layer 120. The gate layer 140 is composed of doped polysilicon. Then, a stopper layer S100, which is to be used in a CMP step to be conducted later, is formed over the gate layer 140. The stopper layer S100 is composed of a silicon nitride layer.

(2) Then, a resist layer (not shown) is formed. Next, the stopper layer S100 is patterned by using the resist layer as a mask. Thereafter, the gate layer 140 is etched by using the patterned stopper layer. As a result, as shown in FIG. 4, the gate layer 140 is patterned to form gate layers 140*a*.

Figure 5:
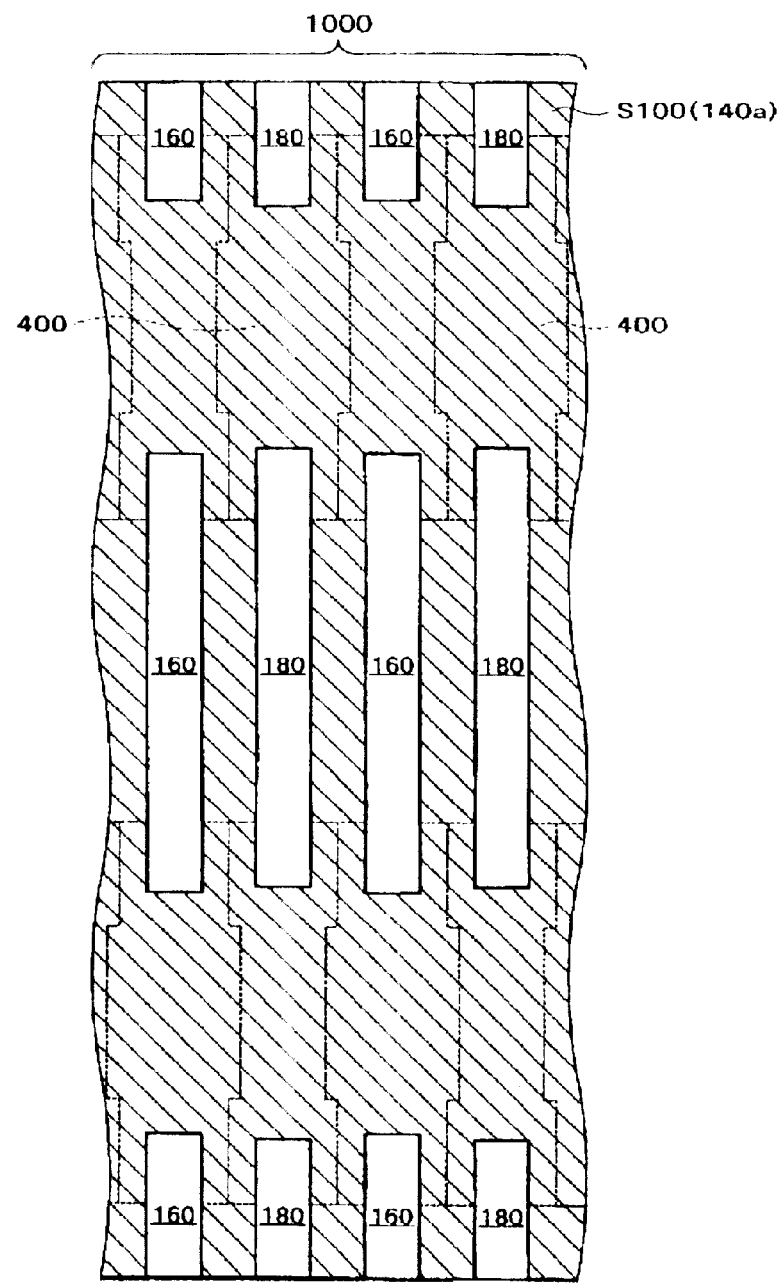
FIG. 5 shows one step in accordance with the embodiment of the present invention.

FIG. 5 shows a plan view of the state after the patterning step. By the patterning step, opening sections 160 and 180 are provided in a stacked layered body of the gate layer 140 and the stopper layer S100 in the memory region 1000. The opening sections 160 and 180 generally correspond to regions where impurity layers 16 and 18 are formed by an ion implantation to be conducted later. Then, in subsequent steps, side dielectric layers and control gates are formed along the side surfaces of the opening sections 160 and 180.

Figure 4:
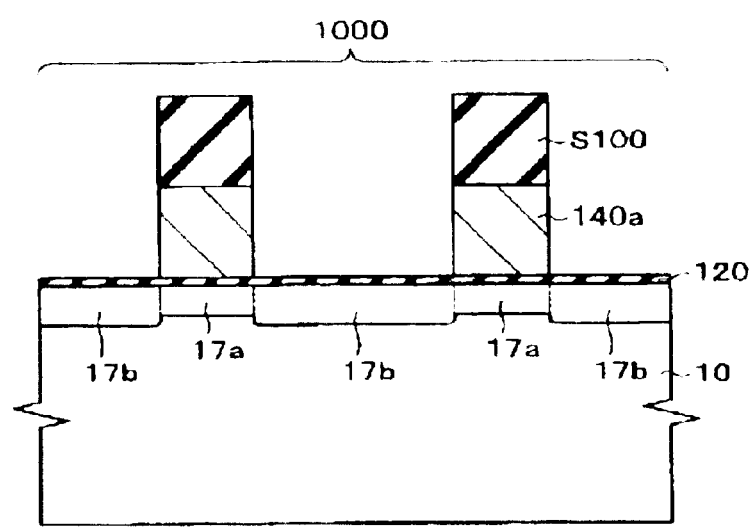
FIG. 4 shows one step in accordance with the embodiment of the present invention.

Then, as shown in FIG. 4, impurity layers 17*b* are formed in the semiconductor substrate 10 by implanting ions of a P-type impurity for preventing punch-through.

Figure 6:
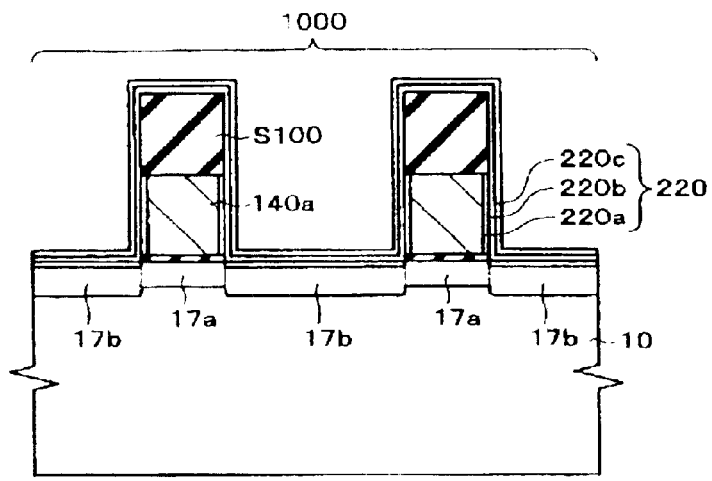
FIG. 6 shows one step in accordance with the embodiment of the present invention.

(3) Then, the surface of the semiconductor substrate is washed with hydrofluoric acid. As a result, exposed portions of the dielectric layer 120 are removed. Next, as shown in FIG. 6, a first silicon oxide layer 220*a* is formed by a thermal oxidation method. The thermally oxidized films are formed between the semiconductor substrate 10 and exposed surfaces of the gate layers 140*a*. It is noted that a CVD method may be used to form the first silicon oxide layer 220*a*.

Then, an annealing treatment is conducted for the first silicon oxide layer 220*a*. The annealing treatment is conducted in an atmosphere containing $NH_3$ gas. This pretreatment makes it easier to evenly deposit a silicon nitride layer 220*b* on the first silicon oxide layer 220*a*. Then, the silicon nitride layer 220*b* can be formed by a CVD method.

Next, a second silicon oxide layer 220*c* is formed by a CVD method, more specifically, a high temperature oxidation (HTO) method. The second silicon oxide layer 220*c* may also be formed by using an ISSG (In-situ Steam Generation) treatment. Films that are formed by the ISSG treatment are dense. When films are formed by the ISSG treatment, an annealing treatment for densifying an ONO film to be described later can be omitted.

It is noted that, in the steps described above, if the silicon nitride layer 220*b* and the second silicon oxide layer 220*c* are formed in the same furnace, contamination of the interface thereof that may occur when they are taken outside the furnace can be prevented. By so doing, ONO films with a uniform quality can be formed, and therefore memory cells 100 having stable electric characteristics can be obtained. Also, a washing step that may be conducted to remove contaminants on the interface is not required, such that the number of steps can be reduced.

After forming the layers described above, an annealing treatment with a wet oxidation or an LMP oxidation may be conducted to densify each of the layers.

In accordance with the present embodiment, the ONO films 220 become second gate dielectric layer 22 and side dielectric layers 24 (see FIG. 2) through a patterning step to be conducted later.

Figure 7:
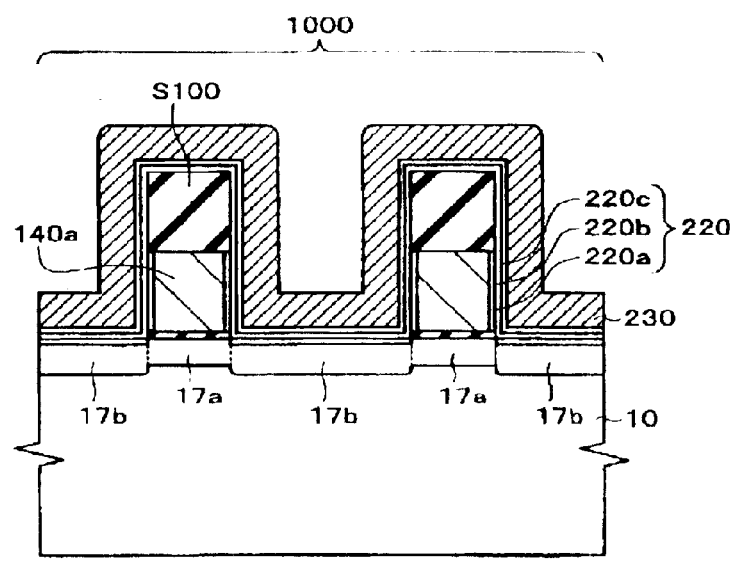
FIG. 7 shows one step in accordance with the embodiment of the present invention.

(4) As shown in FIG. 7, a doped polysilicon layer (second conductive layer) 230 is formed over the second silicon oxide layer 220*c*. The doped polysilicon layer 230 will be etched later and become conductive layers 40 that compose control gates 20 and 30 (see FIG. 1).

Figure 8:
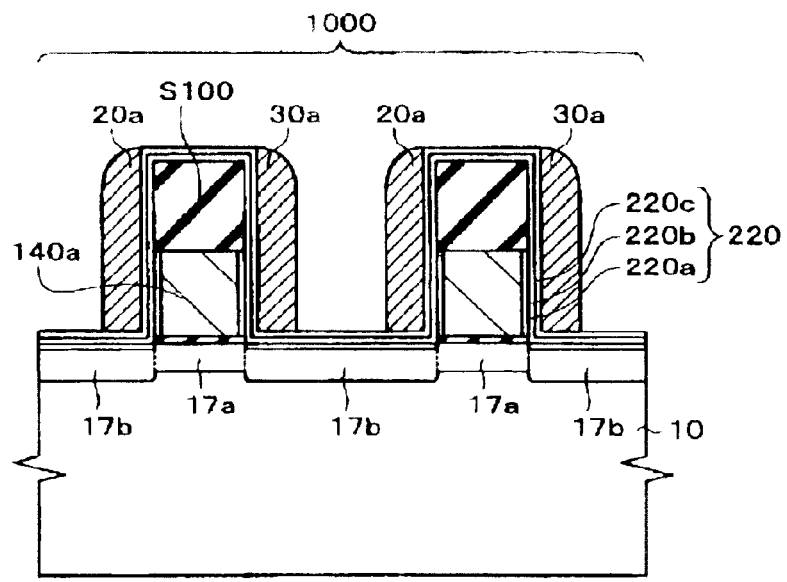
FIG. 8 shows one step in accordance with the embodiment of the present invention.

(5) Then, as shown in FIG. 8, the doped polysilicon layer 230 is isotropically etched to the extent that the second silicon oxide layer 220*c* above the stopper layer S100 is exposed. As a result, doped polysilicon layers 20*a* and 30*a* are formed on the side walls of the gate layers 140*a* and the stopper layers S100. The isotropic etching may be conducted according to, for example, an ICP (Inductive Coupled Plasma) method. The etching gas includes $CF_4$. Also, the isotropic etching may preferably be conducted under conditions where the selection ratio between the doped polysilicon layer 230 and the second silicon oxide layer 220*c* is generally 1, in other words, the etching rate of the doped polysilicon layer and the etching rate of the second silicon oxide layer are generally the same.

Figure 9:
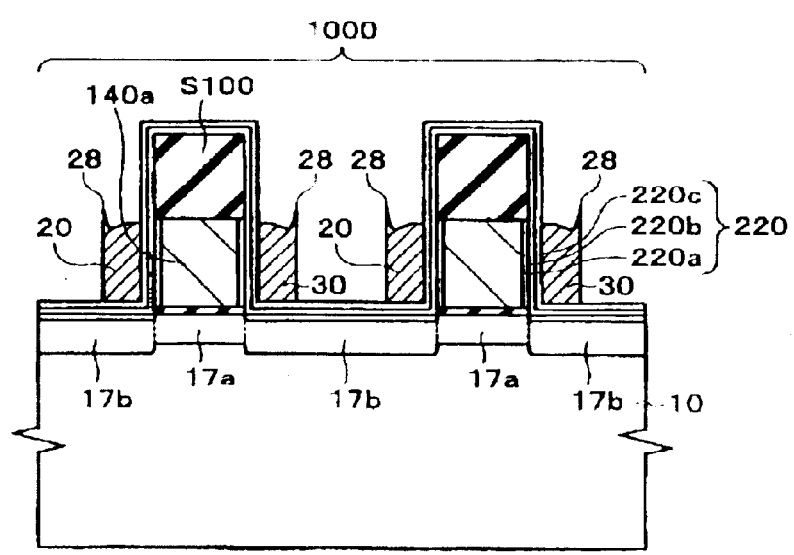
FIG. 9 shows one step in accordance with the embodiment of the present invention.

(6) Next, as shown in FIG. 9, the doped polysilicon layers 20*a* and 30*a* are entirely anisotropically etched. By this, first and second control gates 20 and 30 are formed along side surfaces of the opening sections 160 and 180 (see FIG. 5) in the memory region 1000. Here, as indicated in FIG. 9, the anisotropic etching is conducted until the height of the formed control gates 20 and 30 becomes lower than the height of the gate layers 140*a*. This anisotropic etching is conducted according to, for example, an ICP (Inductive Coupled Plasma) method. The etching gas includes HBr and $O_2$. A gas containing $Cl_2$ and $O_2$ may be used as the etching gas. Also, the anisotropic etching may preferably be conducted under conditions where the selection ratio between the doped polysilicon layers 20*a* and 30*a* and the second silicon oxide layer 220*c*, in other words, the ratio of the etching rate of the doped polysilicon layers with respect to the etching rate of the second silicon oxide layer, is 10–100, and more preferably 50–100.

However, at the time when the etching is completed, there may be occasions where horn sections 28 are formed at the, control gates. The horn sections 28 may be formed by materials that have been once removed by the etching step but re-adhere to the control gates 20 and 30.

Figure 10:
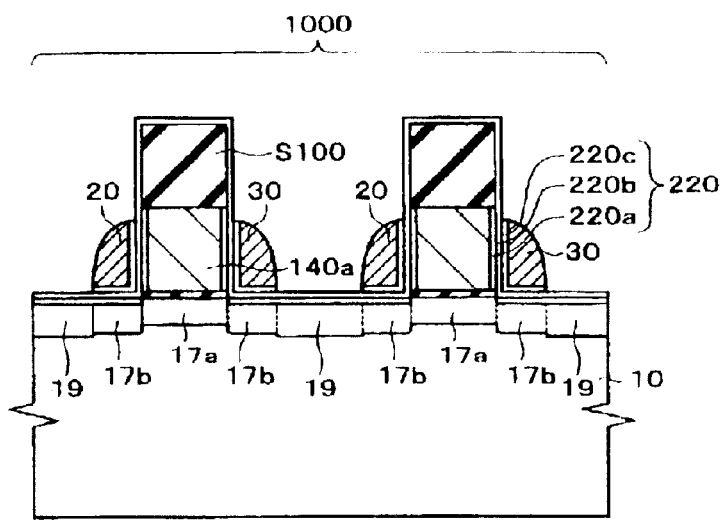
FIG. 10 shows one step in accordance with the embodiment of the present invention.

(7) Next, as shown in FIG. 10, the first and second control gates 20 and 30 are isotropically etched. By this, the horn sections 28 are removed. The isotropic etching is conducted according to, for example, a CDE (Chemical Dry Etching) method, using an etching gas containing fluoride such as CF$_4$. Also, the isotropic etching may preferably be conducted under a condition where the selection ratio between the doped polysilicon layers 20a and 30a and the second silicon oxide layer 220c, in other words, the ratio of the etching rate of the doped polysilicon layers with respect to the etching rate of the second silicon oxide layer, is 3–10, and more preferably 5–10.

Through the steps (5)–(7) described above, the first and second control gates 20 and 30 in the form of sidewalls are obtained, as shown in FIG. 10. The advantages of the above described steps are as follows.

In the steps (6) and (7) described above, by conducting an isotropic etching after the first and second control gates 20 and 30 have been anisotropically etched, the configurations of the first and second control gates 20 and 30 can be readily improved. The reason for this is described below. As shown in FIG. 9, when the anisotropic etching is completed in the step (6) described above, the horn sections 28 may be formed at the control gates. There is a possibility that the horn sections 28 may come in contact with the word lines 50, such that the control gates 20 and 30 become conductive with the word gates 14a. In contrast, in accordance with the present embodiment, the horn sections 28 are removed by the isotropic etching in the step (7). Consequently, the configurations of the control gates can be readily improved.

Next, as shown in FIG. 10, an N-type impurity is ion-implanted to form impurity layers 19 in the semiconductor substrate 10.

Figure 11:
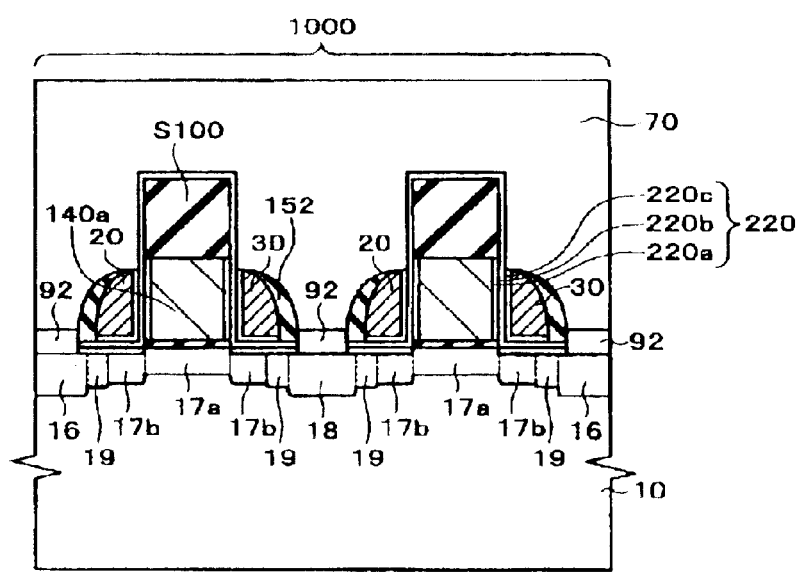
FIG. 11 shows one step in accordance with the embodiment of the present invention.

(8) Next, in the memory region 1000, a dielectric layer such as a silicon oxide layer or a silicon nitride layer (not shown) is formed over the entire surface. Then, by anisotropically etching the dielectric layer, dielectric layers 152 are left on the control gates 20 and 30, as shown in FIG. 11. Further, by this etching, dielectric layers deposited on regions where silicide layers are to be formed in succeeding steps are removed, and the semiconductor substrate is exposed.

Next, as shown in FIG. 11, an N-type impurity is ion-implanted to form impurity layers 16 and 18 in the semiconductor substrate 10.

Next, a metal for forming silicide is deposited over the entire surface thereof. The metal for forming silicide may be, for example, titanium or cobalt. Thereafter, the metal formed over the semiconductor substrate is silicified to form silicide layers 92 on exposed surfaces of the semiconductor substrate. Then, in the memory region 1000, a dielectric layer 70 such as a silicon oxide layer or a silicon nitride layer is formed over the entire surface thereof. The dielectric layer 70 is formed in a manner to cover the stopper layers S100.

Figure 12:
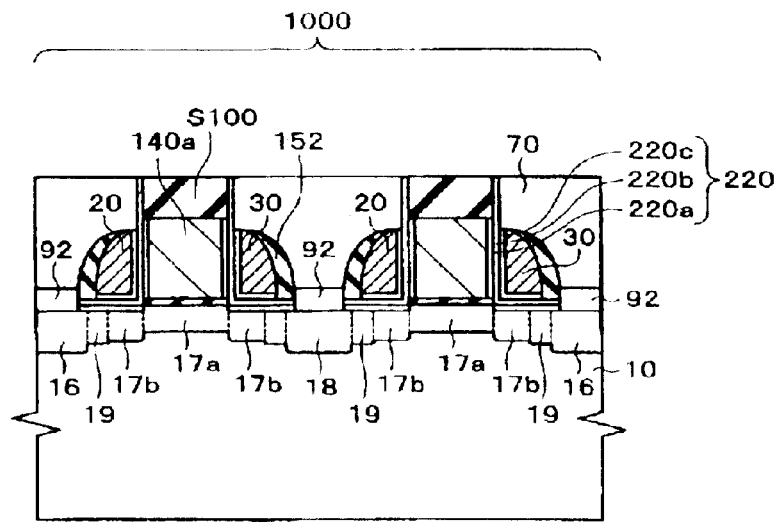
FIG. 12 shows one step in accordance with the embodiment of the present invention.

(9) As shown in FIG. 12, the dielectric layer 70 is polished by a CMP method until the stopper layers S100 are exposed, and the dielectric layer 70 is planarized. By this polishing, the dielectric layers 70 are left between the opposing control gates 20 and 30.

(10) The stopper layers S100 are removed by heated phosphoric acid. As a result, at least the upper surfaces of the gate layers 140a are exposed. Then, a doped polysilicon layer is deposited over the entire surface thereof.

Figure 13:
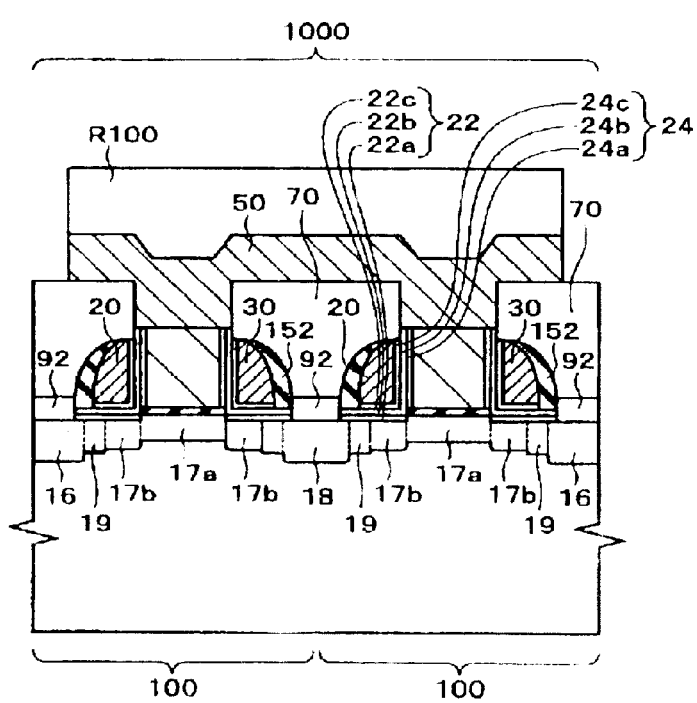
FIG. 13 shows one step in accordance with the embodiment of the present invention.
Figure 14:
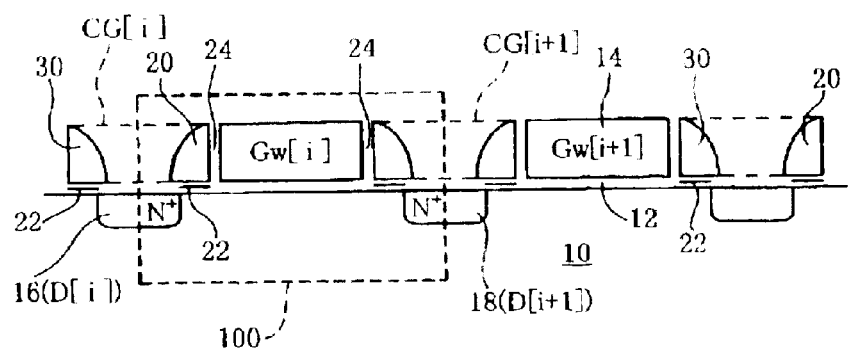
FIG. 14 shows a cross-sectional view of a known MONOS type memory cell.

Then, as shown in FIG. 13, patterned resist layers R100 are formed over the doped polysilicon layer. By patterning the doped polysilicon layer using the resist layers R100 as a mask, word lines 50 are formed.

In succession, the gate layers 140a are etched by using the resist layers R100 as a mask. By this etching, the gate layers 140a without the word lines 50 formed on them are removed. As a result, word gates 14a arranged in an array can be formed. The regions where the gate layers 140a are removed correspond to regions where P-type impurity layers (element isolation impurity layers) 15 are to be formed later (see FIG. 1).

In this etching step, the conductive layers 40 that form the first and second control gates 20 and 30 remain without being etched because they are covered by the dielectric layers 70.

Then, a P-type impurity is doped over the entire surface of the semiconductor substrate 10. As a result, P-type impurity layers (element isolation impurity layers) 15 (see FIG. 1) are formed in the regions between the word gates 14a in the Y direction. By these P-type impurity layers 15, the non-volatile semiconductor memory cells 100 are more securely isolated from one another.

By the steps described above, the semiconductor device shown in FIGS. 1 and 2 is manufactured.

One embodiment of the present invention has been described so far. However, the present invention is not limited to this embodiment, and many modifications can be made within the scope of the subject matter of the present invention. For example, although a semiconductor substrate in a bulk form is used as a semiconductor layer in the above embodiment, a semiconductor layer composed of a SOI substrate may be used.

The entire disclosure of Japanese Patent Application No. 2002-037834 filed Feb. 15, 2002 is incorporated by reference herein.

What is claimed is:

1. A method for manufacturing a non-volatile memory device, the method comprising the steps of:
   forming a first dielectric layer above a semiconductor layer;
   forming a first conductive layer above the first dielectric layer;
   forming a stopper layer above the first conductive layer;
   patterning the stopper layer and the first conductive layer;
   forming an ONO film including a first silicon oxide layer, a silicon nitride layer and a second silicon oxide layer above the semiconductor layer and on both sides of the first conductive layer;
   forming a second conductive layer above the ONO film;
   anisotropically etching the second conductive layer, and then isotropically etching the second conductive layer to form sidewall control gates on both side surfaces of the first conductive layer through the ONO film;
   forming an impurity layer that is to become at least one of a source region and a drain region in the semiconductor layer;
   forming a second dielectric layer over an entire surface of the substrate;
   polishing the second dielectric layer such that the stopper layer is exposed;
   removing the stopper layer; and
   patterning the first conductive layer to form a word gate.

2. A method for manufacturing a non-volatile memory device according to claim 1, wherein, in the step of anisotropically etching the second conductive layer, a selection ratio between the second conductive layer and the second silicon oxide layer composing the ONO film is 10–100.

3. A method for manufacturing a non-volatile memory device according to claim 1, wherein, in the step of isotropically etching the second conductive layer, a selection ratio between the second conductive layer and second silicon oxide layer composing the ONO film is 3–10.

4. A method for manufacturing a non-volatile memory device according to claim 1, further comprising the step of isotropically etching the second conductive layer before the step of anisotropically etching the second conductive layer.

5. A method for manufacturing a non-volatile memory device according to claim 4, wherein the step of isotropically etching the second conductive layer before the step of anisotropically etching the second conductive layer is conducted under a condition where a selection ratio between the second conductive layer and the second silicon oxide layer composing the ONO film is 10–100.

6. A method comprising the steps of:
    forming an ONO film including a fist silicon oxide layer, a silicon nitride layer and a second silicon oxide layer above a semiconductor layer and on both sides of a first conductive layer;
    forming a second conductive layer above the ONO film; and
    anisotropically and isotropically etching the second conductive layer to form sidewall control gates on both side surfaces of the first conductive layer through the ONO film.

7. The method of claim 6 wherein:
    said first conductive layer is formed above a first dielectric layer; and
    the first dielectric layer is formed above the semiconductor layer.

8. The method of claim 7 further comprising, prior to said step of forming said ONO layer, the steps of:
    forming a stopper layer above the first conductive layer; and
    patterning the stopper layer and the first conductive layer prior to said step of forming said ONO layer.

9. The method of claim 8 further comprising, after said step of forming said ONO layer, the steps of:
    forming an impurity layer that is to become at least one of a source region and a drain region in the semiconductor layer;
    forming a second dielectric layer over an entire surface of the substrate;
    polishing the second dielectric layer such that the stopper layer is exposed;
    removing the stopper layer; and
    patterning the first conductive layer to form a word gate.

* * * * *